United States Patent
Jung

(10) Patent No.: US 12,019,484 B2
(45) Date of Patent: Jun. 25, 2024

(54) ELECTRONIC DEVICE INCLUDING AIR VENT

(71) Applicant: Samsung Electronics Co., Ltd., Suwon-si (KR)

(72) Inventor: Yanggyun Jung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 51 days.

(21) Appl. No.: 17/979,388

(22) Filed: Nov. 2, 2022

(65) Prior Publication Data

US 2023/0108414 A1 Apr. 6, 2023

Related U.S. Application Data

(63) Continuation of application No. PCT/KR2022/014829, filed on Sep. 30, 2022.

(30) Foreign Application Priority Data

Oct. 1, 2021 (KR) .................. 10-2021-0130668

(51) Int. Cl.
   *G06F 1/16* (2006.01)
   *H04R 1/28* (2006.01)
   *H05K 5/02* (2006.01)

(52) U.S. Cl.
   CPC .......... *G06F 1/1688* (2013.01); *G06F 1/1637* (2013.01); *G06F 1/1656* (2013.01);
   (Continued)

(58) Field of Classification Search
   CPC .... G06F 1/1637; G06F 1/1656; G06F 1/1688; G06F 1/1698; G06F 1/203; H05K 5/0213
   See application file for complete search history.

(56) References Cited

U.S. PATENT DOCUMENTS

| | | | |
|---|---|---|---|
| 7,228,158 B2 * | 6/2007 | Lee | H04M 1/0216 379/433.02 |
| 7,614,803 B2 * | 11/2009 | Takeuchi | G03B 17/02 396/419 |

(Continued)

FOREIGN PATENT DOCUMENTS

| | | |
|---|---|---|
| CN | 213403396 U | 6/2021 |
| CN | 113365170 A | 9/2021 |

(Continued)

OTHER PUBLICATIONS

International Search Report dated Jan. 13, 2023, issued in International Application No. PCT/KR2022/014829.

*Primary Examiner* — Adrian S Wilson
(74) *Attorney, Agent, or Firm* — Jefferson IP Law, LLP

(57) ABSTRACT

An electronic device is provided. The electronic device includes frame constituting at least a part of the side exterior of the electronic device, an internal mechanical element disposed inside the frame, multiple frame holes formed through the frame at a predetermined interval in an identical shape, an air channel comprising a first hole, at least a part of which is formed through the internal mechanical element in a first direction so as to be connected to at least one of the multiple frame holes, and a second hole formed through the internal mechanical element in a direction perpendicular to the first direction so as to be connected to the first hole, an air vent disposed in the second hole of the air channel, and a speaker channel connected to remaining holes of the multiple frame holes and connected to a speaker module.

20 Claims, 10 Drawing Sheets

(52) U.S. Cl.
CPC ......... *H04R 1/2803* (2013.01); *H05K 5/0213* (2013.01); *G06F 1/1698* (2013.01); *H04R 2499/11* (2013.01)

(56) References Cited

U.S. PATENT DOCUMENTS

| | | | |
|---|---|---|---|
| 7,801,571 B2 * | 9/2010 | Friedman | H04M 1/6041 379/433.02 |
| 9,999,149 B2 * | 6/2018 | Jun | H04R 1/02 |
| 10,015,573 B2 | 7/2018 | Mittleman et al. | |
| 10,021,800 B1 | 7/2018 | Zhang et al. | |
| 10,215,742 B2 * | 2/2019 | Choi | G01N 33/0004 |
| 10,250,729 B1 | 4/2019 | Jeon et al. | |
| 10,356,500 B2 * | 7/2019 | Kim | H04M 1/026 |
| 10,389,007 B1 | 8/2019 | Choi et al. | |
| 10,602,249 B2 | 3/2020 | Jung et al. | |
| 10,887,683 B1 | 1/2021 | Choi et al. | |
| 11,399,085 B2 | 7/2022 | Jung et al. | |
| 11,737,220 B2 * | 8/2023 | Jung | H05K 5/0213 361/807 |
| 2004/0090829 A1 | 5/2004 | Miura et al. | |
| 2007/0123312 A1 * | 5/2007 | Friedman | H04M 1/6041 379/433.02 |
| 2015/0219608 A1 * | 8/2015 | Choi | G01N 33/0009 73/23.2 |
| 2019/0068770 A1 | 2/2019 | Seo et al. | |
| 2019/0196560 A1 | 6/2019 | Cha et al. | |
| 2020/0107446 A1 * | 4/2020 | Mäki | H04M 1/035 |
| 2020/0329132 A1 | 10/2020 | Jung et al. | |
| 2021/0034114 A1 | 2/2021 | Cha et al. | |
| 2021/0058690 A1 | 2/2021 | Lee et al. | |
| 2021/0243907 A1 * | 8/2021 | Jung | H05K 5/0213 |
| 2022/0150619 A1 | 5/2022 | Park et al. | |
| 2022/0174827 A1 * | 6/2022 | Jung | H05K 5/0213 |
| 2023/0413459 A1 * | 12/2023 | Jung | H05K 5/0215 |

FOREIGN PATENT DOCUMENTS

| | | |
|---|---|---|
| JP | 4757292 B2 | 8/2011 |
| JP | 2014-093611 A | 5/2014 |
| KR | 10-2015-0033976 A | 4/2015 |
| KR | 10-2019-0022094 A | 3/2019 |
| KR | 10-2019-0034063 A | 4/2019 |
| KR | 10-2019-0076658 A | 7/2019 |
| KR | 10-2019-0127184 A | 11/2019 |
| KR | 10-2091611 B1 | 3/2020 |
| KR | 10-2020-0119003 A | 10/2020 |
| KR | 10-2020-0125728 A | 11/2020 |
| KR | 10-2021-0015268 A | 2/2021 |
| KR | 10-2021-0023188 A | 3/2021 |
| KR | 10-2021-0097335 A | 8/2021 |
| KR | 10-2022-0061784 A | 5/2022 |
| WO | 2021/080041 A1 | 4/2021 |

* cited by examiner

ELECTRONIC DEVICE INCLUDING AIR VENT

CROSS-REFERENCE TO RELATED APPLICATION(S)

This application is a continuation application, claiming priority under § 365(c), of an International application No. PCT/KR2022/014829, filed on Sep. 30, 2022, which is based on and claims the benefit of a Korean patent application number 10-2021-0130668, filed on Oct. 1, 2021, in the Korean Intellectual Property Office, the disclosure of which is incorporated by reference herein in its entirety.

TECHNICAL FIELD

The disclosure relates to an electronic device including an air vent.

BACKGROUND ART

A mechanical element constituting the exterior of an electronic device may have various openings or holes formed therein to connect the inside and outside of the electronic device.

This may be for the purpose of outputting sounds from a speaker device to the outside, or transferring external sounds to a microphone device. In addition, an air passage may be provided to solve various problems caused by a difference in atmospheric pressure between the inside and outside of the electronic device.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

When a mechanical element constituting the exterior of an electronic device has a hole for an audio device (speaker device, microphone device, or the like) and another hole for an air passage formed therein separately, the aesthetic impression of the electronic device may be degraded, and the increased process time for processing may increase the electronic device manufacturing cost.

Meanwhile, an air vent may be disposed in the air passage to block inflow of external moisture. In some cases, moisture flowing into the air passage may damage the air vent, or a pointed object may enter the air passage, thereby breaking the air vent.

The air passage may be connected to the inner space of the electronic device, and various electronic components may be disposed in the inner space. If the air vent is broken, external moisture may flow into the part on which electronic components exist, thereby immersing the electronic components.

Aspects of the disclosure are to address at least the above-mentioned problems and/or disadvantages and to provide at least the advantages described below. Accordingly, an aspect of the disclosure is to provide an electronic device including a structure capable of eliminating or solving the above-mentioned problems.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a frame constituting at least a part of a side exterior of the electronic device, an internal mechanical element disposed inside the frame, a plurality of frame holes formed through the frame at a predetermined interval in an identical shape, an air channel including a first hole, at least a part of which is formed through the internal mechanical element in a first direction so as to be connected to at least one of the plurality of frame holes, and a second hole formed through the internal mechanical element in a direction perpendicular to the first direction so as to be connected to the first hole, an air vent disposed in the second hole of the air channel, and a speaker channel connected to remaining holes of the plurality of frame holes and connected to a speaker module.

In accordance with another aspect of the disclosure, a channel structure of an electronic device is provided. The channel structure includes a plurality of frame holes formed through a frame constituting at least a part of the side exterior of the electronic device at a predetermined interval in an identical shape, an air channel including a first hole, at least a part of which is formed through an internal mechanical element disposed inside the frame in a first direction so as to be connected to at least one of the plurality of frame holes, and a second hole formed through the internal mechanical element in a direction perpendicular to the first direction so as to be connected to the first hole, an air vent disposed in the second hole of the air channel, and a speaker channel connected to remaining holes of the plurality of frame holes and connected to a speaker module.

Advantageous Effects of Invention

According to various embodiments disclosed herein, a hole for an audio device and another hole for an air passage are fabricated in a single process step, thereby reducing electronic device process costs and improving the aesthetic impression of the electronic device.

In addition, the air vent disposition position may be adjusted such that the air vent is not easily broken by moisture or objects introduced from the outside.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

Figure 1:
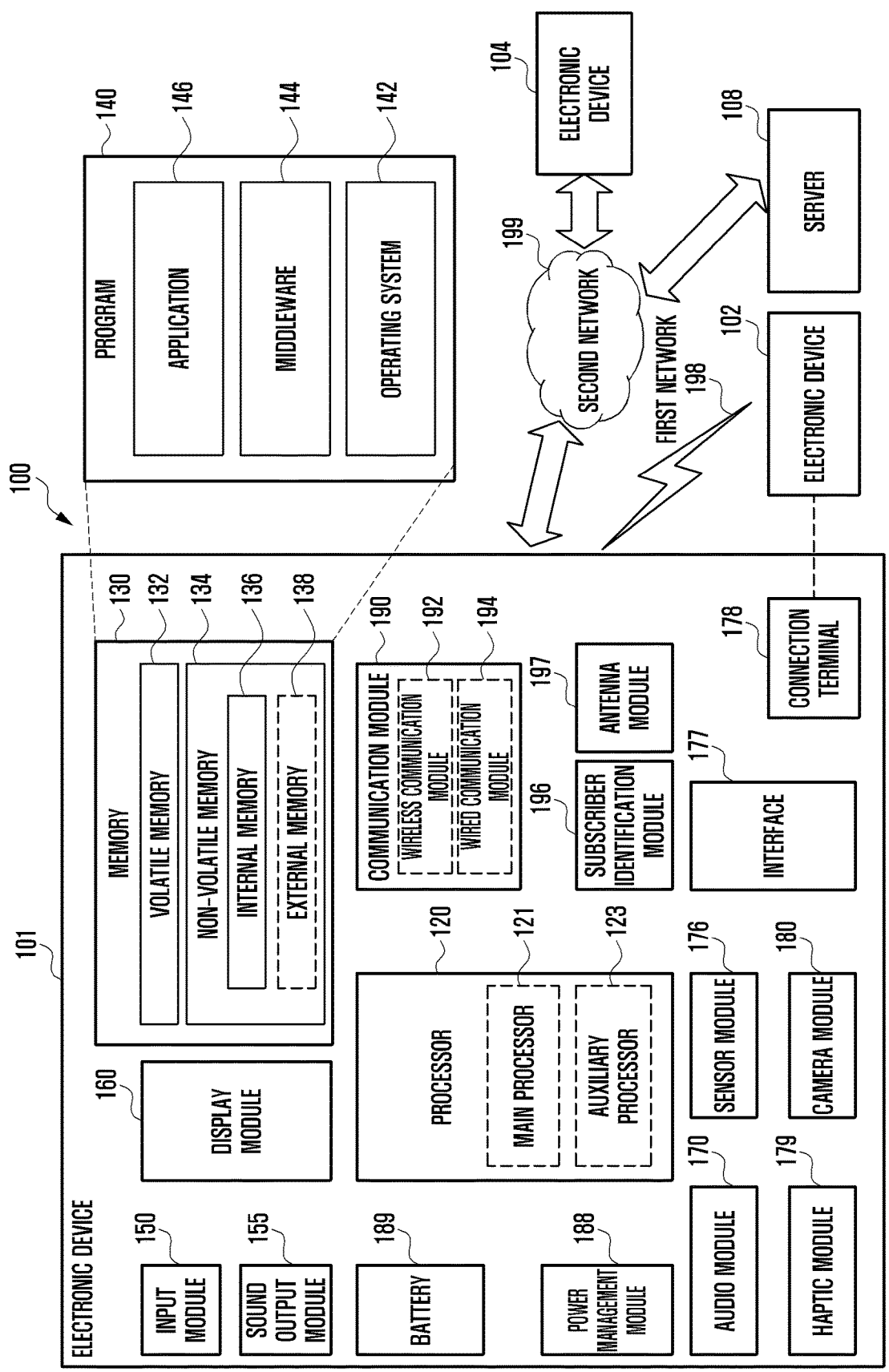
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199. According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 or 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
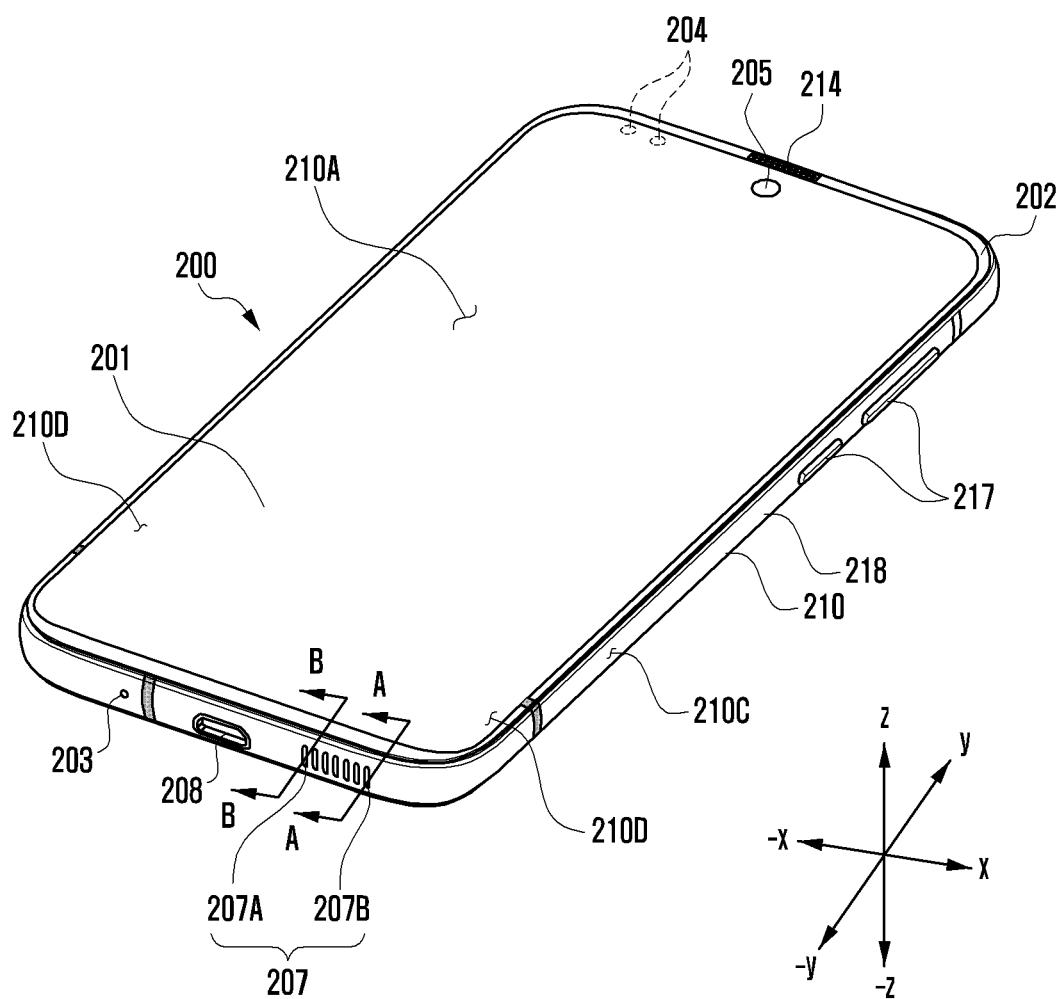
FIG. 2A is a front perspective view of an electronic device according to an embodiment of the disclosure.

FIG. 2A is a front perspective view of an electronic device according to an embodiment of the disclosure.

Figure 2B:
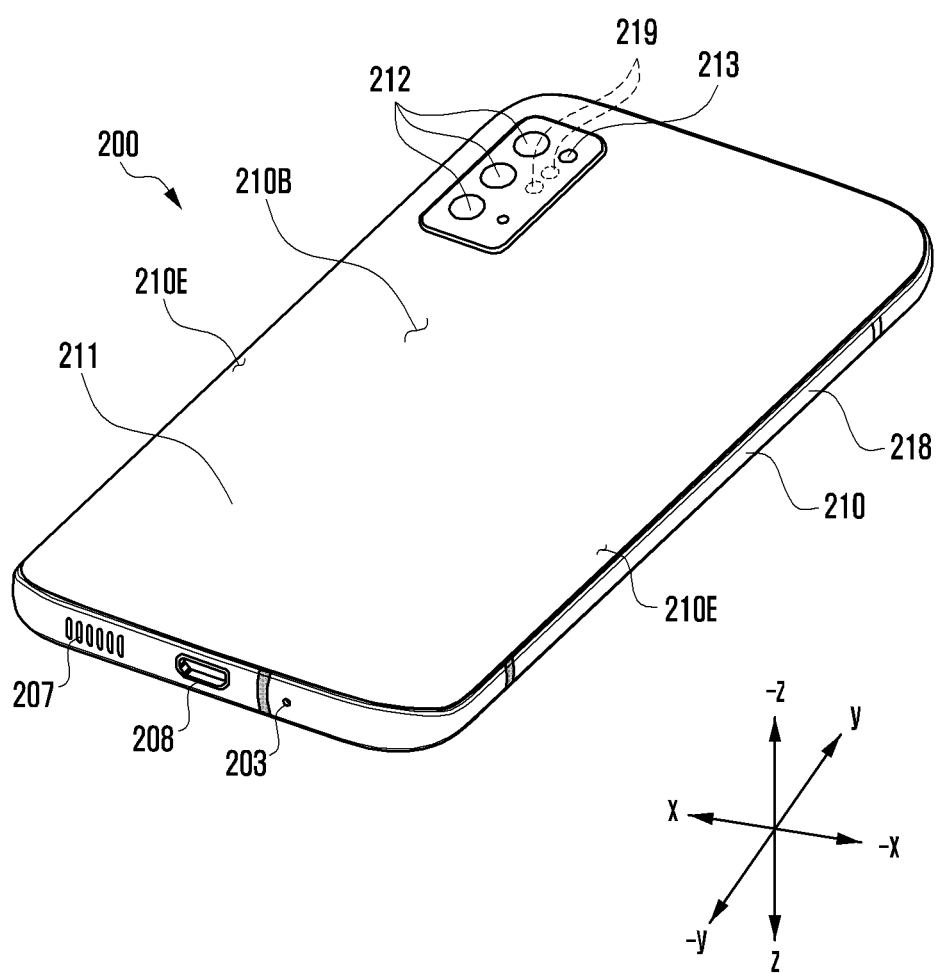
FIG. 2B is a rear perspective view of the electronic device of FIG. 2A according to an embodiment of the disclosure.

FIG. 2B is a rear perspective view of the electronic device of FIG. 2A according to an embodiment of the disclosure.

The electronic device 200 to be described below may include at least one of the components of the electronic device 101 described above with reference to FIG. 1.

With reference to FIGS. 2A and 2B, the electronic device 200 according to an embodiment may include a housing 210 that includes a first surface (or front surface) 210A, a second surface (or rear surface) 210B, and a side surface 210C surrounding a space between the first surface 210A and the second surface 210B. In another embodiment (not shown), the housing 210 may refer to a structure forming a part of the first surface 210A, the second surface 210B, and the side surface 210C in FIG. 2A. According to an embodiment, the first surface 210A may be formed by a front plate 202 (e.g., glass plate or polymer plate including various coating layers) whose at least a portion is substantially transparent. The second surface 210B may be formed by a rear plate 211 that is substantially opaque. The rear plate 211 may be formed by, for example, coated or tinted glass, ceramic, polymer, metal (e.g., aluminum, stainless steel (STS), or magnesium), or a combination of at least two thereof. The side surface 210C may be formed by a side bezel structure (or "side member") 218 coupled to the front plate 202 and the rear plate 211 and including a metal and/or a polymer. In a certain embodiment, the rear plate 211 and side bezel structure 218 may be integrally formed and include the same material (e.g., metal material such as aluminum).

In the illustrated embodiment, the front plate 202 may include a first region 210D that is curved and seamlessly extended from the first surface 210A toward the rear plate at opposite ends of the longer edge of the front plate 202. In the illustrated embodiment (see FIG. 2B), the rear plate 211 may include a second region 210E that is curved and seamlessly extended from the second surface 210B toward the front plate 202 respectively at opposite ends of the longer edge. In a certain embodiment, the front plate 202 or the rear plate 211 may include only one of the first region 210D and the second region 210E. In a certain embodiment, the front plate 202 may not include the first region and the second region, but may include only a flat surface disposed parallel to the second surface 210B. In the above embodiments, when the electronic device is viewed from the side thereof, the side bezel structure 218 may have a first thickness (or width) on a side where the first region 210D or the second region 210E is not included, and may have a second thickness thinner than the first thickness on a side where the first region 210D or the second region 210E is included.

According to an embodiment, the electronic device 200 may include at least one or more of display 201, input device 203, sound hole 207 and 214, sensor modules 204 and 219, camera modules 205 and 212, key input device 217, indicator (not shown), or connector 208. In a certain embodiment, at least one of the elements (e.g., key input device 217 or indicator) may be omitted from the electronic device 200, or another element may be added to the electronic device 200.

The display 201 may be exposed, for example, through a significant portion of the front plate 202. In a certain embodiment, at least a portion of the display 201 may be exposed through the front plate 202 forming the first surface 210A and the first region 210D of the side surface 210C. The display 201 may be coupled to or disposed adjacent to a touch sensing circuit, a pressure sensor capable of measuring the intensity (pressure) of a touch, and/or a digitizer that detects a magnetic field type stylus pen. In a certain embodiment, at least some of the sensor modules 204 and 219, and/or at least some of the key input devices 217 may be disposed on the first region 210D and/or the second region 210E.

The input device 203 may include a microphone 203. In a certain embodiment, the input device 203 may include a plurality of microphones 203 arranged to detect the direction of a sound. In a certain embodiment, the microphone 203, the speakers, and the connector 208 may be at least partially disposed in the internal space of the electronic device 200, and may be exposed to the external environment through at least one hole formed in the housing 210. In a certain embodiment, the hole formed in the housing 210 may be commonly used for the microphone and the speakers. In a certain embodiment, the sound hole 207 and 214 may include a speaker (e.g., piezo speaker) that operates in isolation from the hole formed in the housing 210.

The sensor modules 204 and 219 may generate an electrical signal or a data value corresponding to an internal operating state of the electronic device 200 or an external environmental state. The sensor modules 204 and 219 may include, for example, a first sensor module 204 (e.g., proximity sensor) and/or a second sensor module (not shown) (e.g., fingerprint sensor) disposed on the first surface 210A of the housing 210, and/or a third sensor module 219 (e.g., HRM sensor) disposed on the second surface 210B of the housing 210. The fingerprint sensor may be disposed on the first surface 210A (e.g., Ultrasonic or optical fingerprint sensor) of the housing 210, on a portion of the first surface 210A, and/or under the display 201. The electronic device 200 may further include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, a proximity sensor, or an illuminance sensor.

The camera modules 205 and 212 may include a first camera module 205 disposed on the first surface 210A of the electronic device 200, a second camera module 212 disposed on the second surface 210B, and/or a flash 213. The camera modules 205 and 212 may include one or plural lenses, an image sensor, and/or an image signal processor. The flash 213 may include, for example, a light emitting diode or a xenon lamp. In a certain embodiment, two or more lenses (wide-angle lens, ultra-wide-angle lens, or telephoto lens) and image sensors may be arranged in one surface of the electronic device 200.

The key input devices 217 may be arranged in the side surface 210C of the housing 210. In another embodiment, the electronic device 200 may not include some or all of the above-mentioned key input devices 217, and a key input device 217 not included may be implemented on the display 201 in a different form such as a soft key. In another embodiment, the key input devices 217 may be implemented using a pressure sensor included in the display 201.

The indicator may be disposed on, for example, the first surface 210A of the housing 210. The indicator may provide, for example, state information of the electronic device 200 in a light form (e.g., light emitting element). In another embodiment, the light emitting element may provide a light source interacting with, for example, the operation of the camera module 205. The indicator may include, for example, a light emitting diode (LED), an IR LED, and/or a xenon lamp.

The connector holes 208 may include a first connector hole 208 capable of accepting a connector (e.g., universal serial bus (USB) connector or interface connector port module (IF module)) for transmitting and receiving power and/or data to and from an external electronic device, and/or a second connector hole (e.g., earphone jack) (not shown) capable of accepting a connector for transmitting and receiving an audio signal to and from an external electronic device.

Some of the camera modules 205 and 212, some of the sensor modules 204 and 219, or the indicator may be disposed to be exposed through the display 201. For example, the camera module 205, the sensor module 204, or the indicator may be arranged in the internal space of the electronic device 200 so as to be in contact with the external environment through an opening of the display 201 perforated up to the front plate 202 or a transmissive region. According to an embodiment, the region in which the display 201 and the camera module 205 face each other may be formed as a transmissive region having a preset transmittance as a part of the content display area. According to an embodiment, the transmissive region may be formed to have a transmittance in a range of about 5 percent to about 20 percent. This transmissive region may include a region overlapping an effective area (e.g., angle-of-view area) of the camera module 205 through which light passes for image generation with an image formed by an image sensor. For example, the transmissive region of the display 201 may include a region having a lower pixel density than surrounding regions. For example, the transmissive region may replace the opening. For example, the camera module 205 may include an under display camera (UDC). In another embodiment, a certain sensor module 204 may be disposed in the internal space of the electronic device so as to perform its function without being visually exposed through the front plate 202. For example, in this case, the region of the display 201 facing the sensor module may not need a perforated opening.

According to various embodiments, although the electronic device 200 has a bar-type or plate-type appearance, the disclosure is not limited thereto. For example, the illustrated electronic device 200 may be a part of a foldable electronic device, a slidable electronic device, a stretchable electronic device, and/or a rollable electronic device. "Foldable electronic device", "slidable electronic device", "stretchable electronic device", and/or "rollable electronic device" may mean an electronic device having a display (e.g., display 330 in FIG. 3) that can be deformed by bending so that at least a portion of the display may be folded, wound or rolled, at least partially expanded in area, and/or accommodated inside the housing (e.g., housing 210 in FIGS. 2A and 2B). A foldable electronic device, a slidable electronic device, a stretchable electronic device, and/or a rollable electronic device can be used with an extended screen display area by unfolding the display or exposing a larger area of the display to the outside according to the needs of the user.

Figure 3:
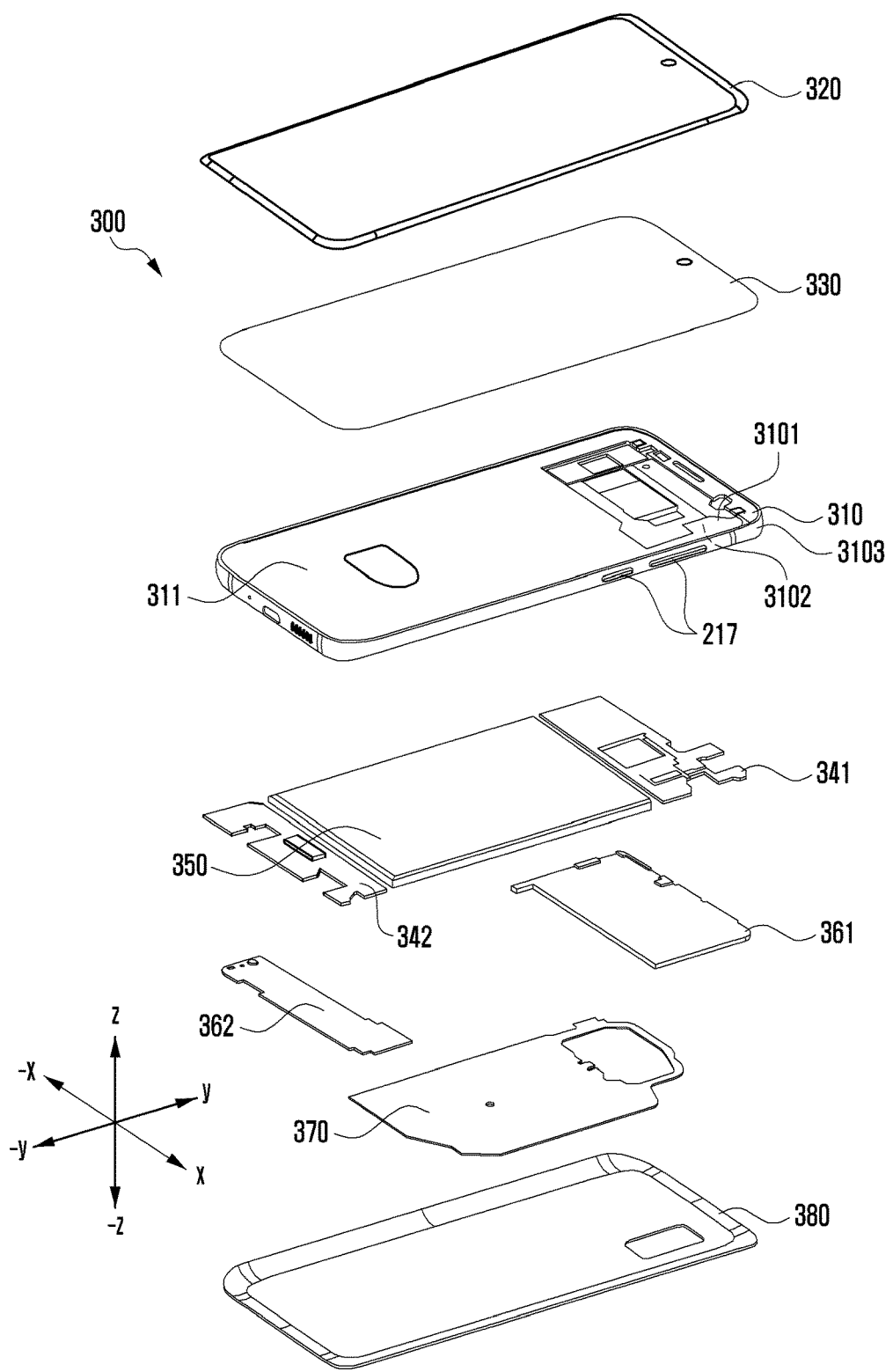
FIG. 3 is an exploded perspective view of an electronic device according to an embodiment of the disclosure.

FIG. 3 is an exploded perspective view of the electronic device 200 of FIG. 2A according to an embodiment of the disclosure.

The electronic device 300 of FIG. 3 may be at least partially similar to the electronic device 200 of FIGS. 2A and 2B, or may include other embodiments of an electronic device.

With reference to FIG. 3, the electronic device 300 (e.g., electronic device 200 in FIG. 2A or 2B) may include a side member 310 (e.g., side bezel structure), a first support member 311 (e.g., bracket or support structure), a front plate 320 (e.g., front cover), a display 330 (e.g., display 201 in FIG. 2A), a board 341, 342 (e.g., printed circuit board (PCB), flexible PCB (FPCB), or rigid-flexible PCB (RFPCB)), a battery 350, second support members 361 and 362 (e.g., rear case), an antenna 370, and a rear plate 380 (e.g., rear cover). In a certain embodiment, at least one of the components (e.g., first support member 311 or second support member 360) may be omitted from the electronic device 300 or other components may be additionally included therein. At least one of the components of the electronic device 300 may be the same as or similar to at least one of the components of the electronic device 200 of FIG. 2A or 2B, and repeated descriptions will be omitted below.

According to various embodiments, the side member 310 may include a first surface 3101 facing a first direction (e.g., a z-axis direction), a second surface 3102 facing a direction opposite to the first surface 3101, and a side surface 3103 surrounding the space between the first surface 3101 and the second surface 3102. According to an embodiment, at least a portion of the side surface 3103 may form an exterior of the electronic device. According to an embodiment, the support member 311 may be disposed in such a way that it extends from the side member 310 toward the inner space of the electronic device 300. In various embodiments, the support member 311 may be disposed separately from the side member 310. According to an embodiment, the side member 310 and/or the support member 311 may be formed of, for example, a metal material and/or a non-metal material (e.g., a polymer). According to an embodiment, the support member 311 may support at least a portion of the display 330 through the first surface 3101, and at least one substrate 341, 342 through the second surface 3102, and/or may be arranged to support at least a portion of the battery 350. According to an embodiment, the at least one substrate 341 and 342 is a first substrate 341 (e.g., a main substrate) disposed on one side with respect to the battery 350 in the internal space of the electronic device 300. and a second substrate 342 (e.g., a sub substrate) disposed on the other side. According to an embodiment, the first substrate 341 and/or the second substrate 342 may include a processor, a memory, and/or an interface. The processor may include, for example, one or more of a central processing unit, an application processor, a graphics processing unit, an image signal processor, a sensor hub processor, and a communication processor.

The memory may include, for example, a volatile memory or a non-volatile memory.

The interface may include, for example, a high definition multimedia interface (HDMI), a universal serial bus (USB) interface, an SD card interface, and/or an audio interface. The interface may, for example, electrically or physically connect the electronic device 300 to an external electronic device, and may include a USB connector, an SD card/multimedia card (MMC) connector, or an audio connector.

The battery 350 is a device for supplying power to at least one component of the electronic device 300, and may include, for example, a non-rechargeable primary cell, a rechargeable secondary cell, or a fuel cell. At least a portion of the battery 350 may be disposed substantially coplanar with the board 341, 342, for example. The battery 350 may be integrally disposed inside the electronic device 300. In another embodiment, the battery 350 may be disposed attachably and detachably with the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform short-range communication with an external device or wirelessly transmit and receive power required for charging. In another embodiment, an antenna structure may be formed by a part of the side bezel structure 310 and/or the first support member 311 or a combination thereof.

In various embodiments, the electronic device 300 may further include a digitizer for detecting an external electronic pen.

Figure 4A:
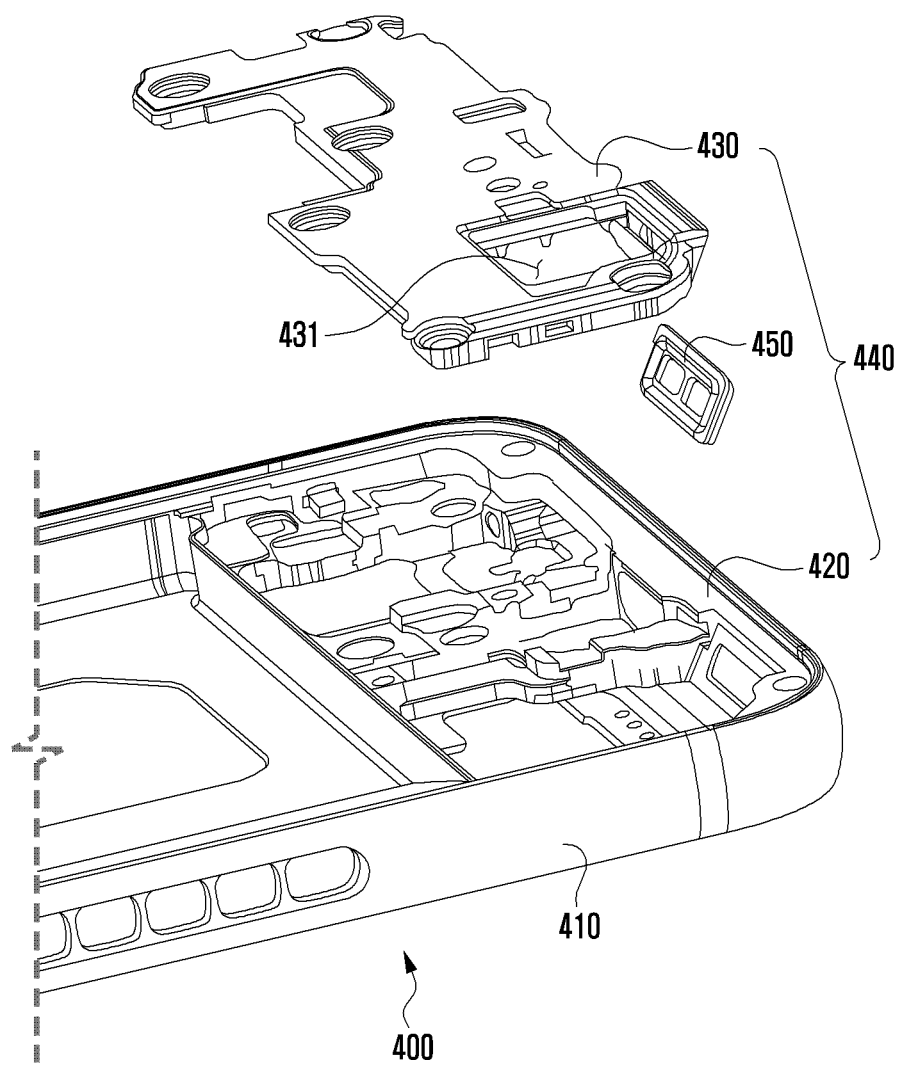
FIG. 4A is an exploded perspective view of some elements of an electronic device according to an embodiment of the disclosure.

FIG. 4A is an exploded perspective view of some elements of an electronic device according to an embodiment of the disclosure.

Figure 4B:
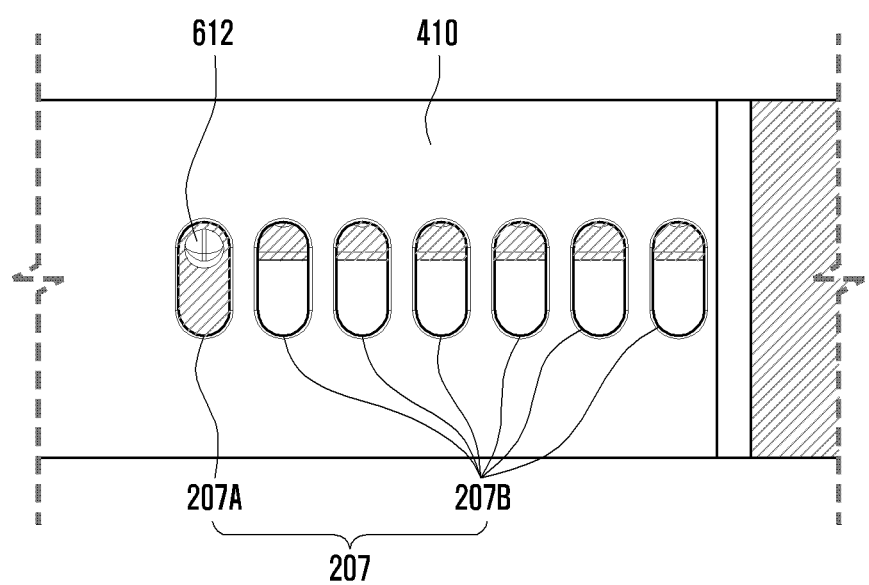
FIG. 4B is a view illustrating the shape of a frame hole according to an embodiment of the disclosure.

FIG. 4B is a view illustrating the shape of a frame hole according to an embodiment of the disclosure.

Figure 5:
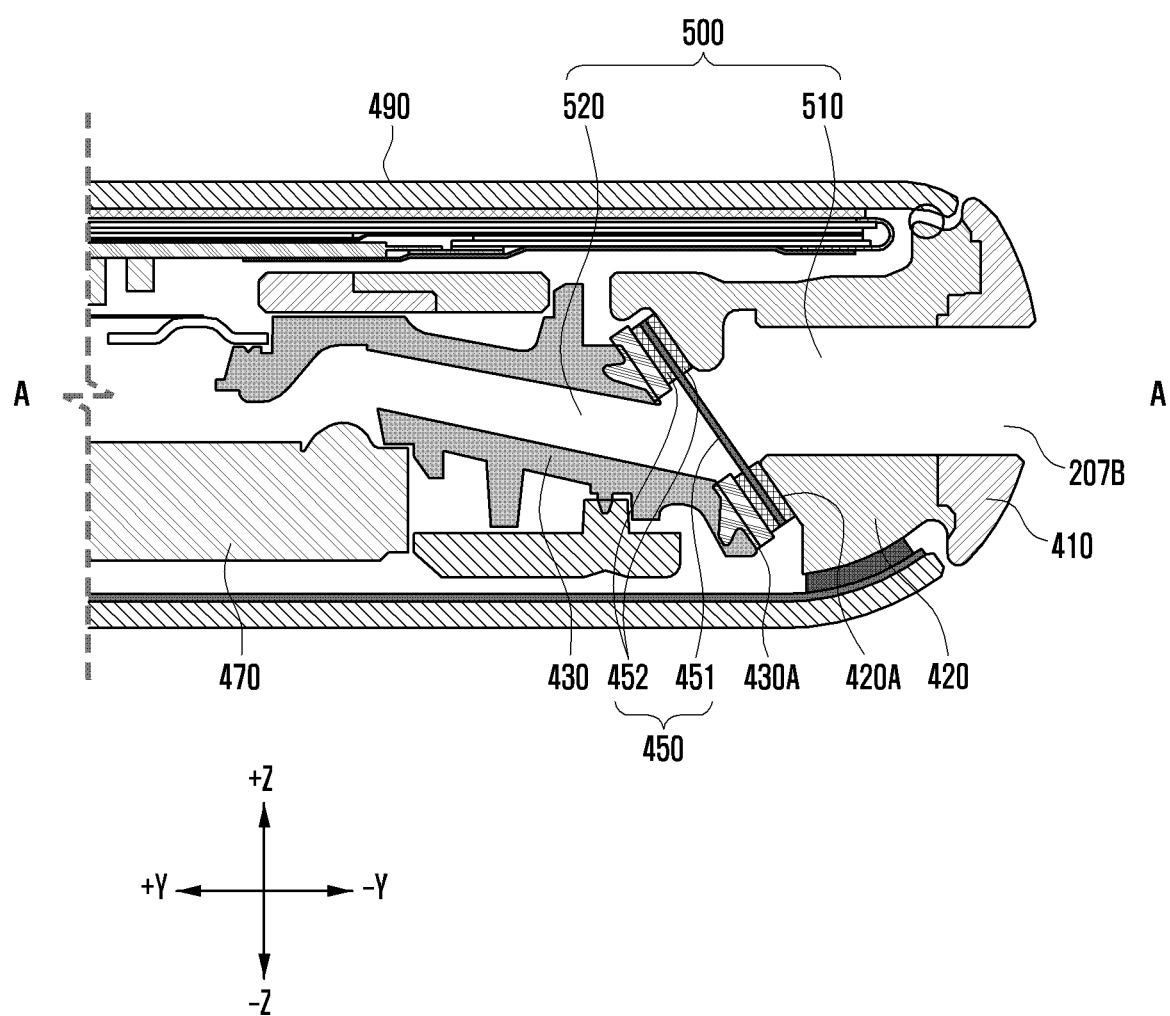
FIG. 5 is a cross-sectional view cut along line A-A of FIG. 2A according to an embodiment of the disclosure.

FIG. 5 is a cross-sectional view cut along line A-A of FIG. 2A according to an embodiment of the disclosure.

Figure 6:
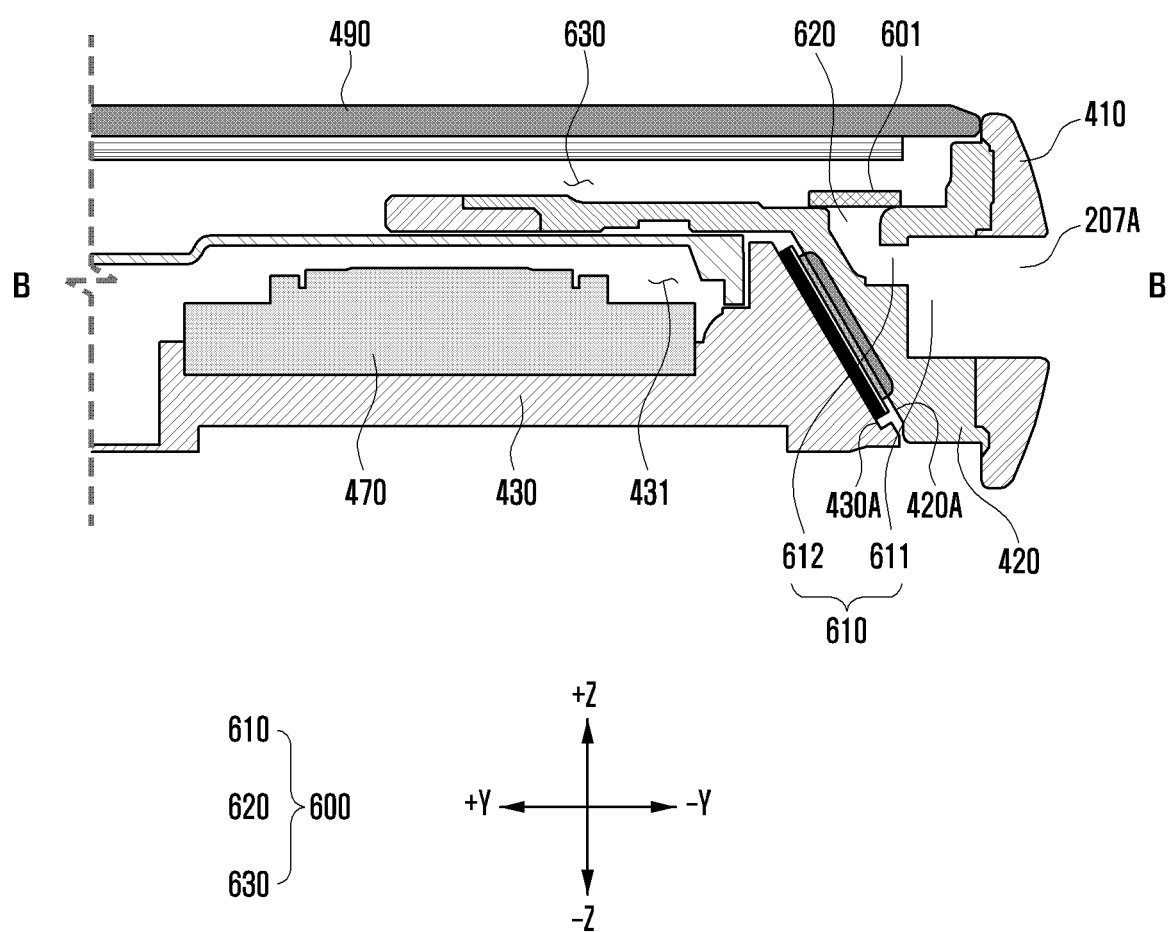
FIG. 6 is a cross-sectional view cut along line B-B of FIG. 2A according to an embodiment of the disclosure.

FIG. 6 is a cross-sectional view cut along line B-B of FIG. 2A according to an embodiment of the disclosure.

Figure 7:
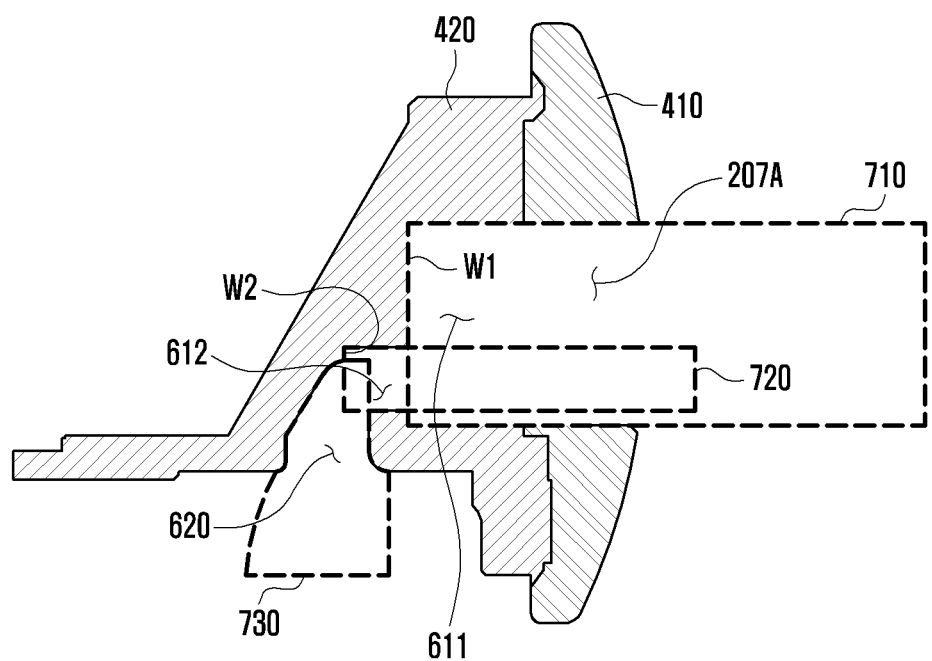
FIG. 7 is a view showing a method for forming an air channel according to an embodiment of the disclosure.

FIG. 7 is a view showing a method for forming an air channel according to an embodiment of the disclosure.

The electronic device 400 to be described below may be an electronic device 400 similar to the electronic device 101, 200, and 300 described with reference to FIGS. 1, 2A, 2B, and 3. For example, the electronic device 400 may be an electronic device including a frame hole (e.g., the sound hole 207 of FIG. 2A) as illustrated in FIG. 2A.

The electronic device 400 disclosed herein may include a channel structure including at least one passage configured to guide the delivery of sound or air. Here, a "channel" may mean a passage for guiding the delivery of sound (sound waves) or air. For example, a channel may mean a physical space. A channel may include a space filled with a medium (e.g., air) capable of delivering sound waves. Hereinafter, the delivery of sound through a channel may mean the delivery of sound via a specific space. In addition, air may be delivered through a channel, and the outside of the electronic device 400 and an inner space of the electronic device 400 may be connected through a channel.

A channel structure may include a speaker channel 500 and an air channel 600. The speaker channel 500 may mean a channel connected to a speaker module 470 configured to generate sound according to an electrical signal. The air channel 600 may mean a channel configured to connect the inner space of the electronic device 400 and the outside of the electronic device 400. The air channel 600 may be configured to reduce an atmospheric pressure difference between the inner space of the electronic device 400, in which various components of the electronic device 400 are arranged, and the outside of the electronic device 400. The air channel 600 may be configured to prevent various problems (e.g., a fogging problem on a window member included in the electronic device 400, a non-operable problem of a barometric pressure sensor, a non-restoration problem of a diaphragm included in the speaker module 470, or the like) due to the atmospheric pressure difference.

Referring to FIG. 4A, the electronic device 400 may include a frame 410 (e.g., the housing 210 of FIG. 2A). At least a part of the frame 410 may be configured to form the side exterior of the electronic device 400. The frame 410 may be formed of various materials. For example, the frame 410 may be formed of various materials such as a metal material, a metal alloy material, a synthetic resin material, and a composite material. Since the frame 410 forms the exterior of the electronic device 400, the frame may be formed of a material having high a wear resistance property, a corrosion resistance property, and great strength. Multiple holes may be formed through the frame 410 as necessary. The multiple holes may be formed at various positions of the frame 410. For example, frame holes 207 to be described later may be a hole formed through the frame 410 to be connected to the speaker channel 500 and/or the air channel 600. The frame 410 may be configured to form the exterior of the electronic device 400. Therefore, sound generated in the speaker module 470 may be output to the outside through the hole formed in the frame 410, external air may be introduced therethrough, or internal air of the electronic device 400 may be discharged therethrough.

In an embodiment, a housing assembly 440, which is configured to support various elements constituting the electronic device 400, may be disposed inside the frame 410. For example, the housing assembly 440 may include an internal mechanical element 420 and a support mechanical element 430. The shape of the housing assembly 440 illustrated in FIG. 4A may be merely an example. In addition, the shape of the housing assembly 440 may be variously changed, and the layout of the housing assembly 440 may also be variously changed.

Referring to FIG. 6, in an embodiment, at least a part of the support mechanical element 430 may be configured to support the speaker module 470. For example, the support mechanical element 430 may include a speaker accommodating part 431 formed to correspond to the outer shape of the speaker module 470. The speaker module 470 may be disposed in the speaker accommodating part 431 formed on the support mechanical element 430. The support mechanical element 430 may be fixed inside the electronic device 400 in various ways, and thus the speaker module 470 may be fixed to the electronic device 400.

Referring to FIGS. 4A, 4B, and 5, the internal mechanical element 420 may be disposed inside the frame 410 such that at least a part thereof is in contact with the frame 410 and the support mechanical element 430.

In various embodiments, the internal mechanical element 420 and the support mechanical element 430 may be integrally formed.

In various embodiments, the internal mechanical element 420 and the support mechanical element 430 may be formed of various materials. For example, the internal mechanical element 420 and the support mechanical element 430 may be formed of a metal material, an alloy material, a synthetic resin material, and a composite material. The internal mechanical element 420 and the support mechanical element 430 may be formed of different materials, and may be formed of the same material. In addition, the internal mechanical element 420 and the support mechanical element 430 may be formed of the same material as or different materials from the frame 410. For example, the frame 410 may be formed of a metal material or a metal alloy material, and the internal mechanical element 420 and the support mechanical element 430 may be formed of a synthetic resin material.

Referring to FIG. 4B, the multiple frame holes 207 may be formed through the frame 410. The frame holes 207 may be formed through the frame 410 in a first direction (e.g., the −Y-axis direction of FIG. 5). The multiple frame holes 207 may be formed through the frame 410 in an identical shape and may be spaced apart from each other at the same interval. For example, as illustrated in FIG. 4B, the frame holes 207 may be formed through the frame 410 in an elliptical shape and may be spaced apart from each other at the same interval. The number of the frame holes 207 may be variously changed. For example, as illustrated in FIG. 4B, the number of the frame holes 207 may be seven.

In various embodiments disclosed herein, some of the multiple frame holes 207 may be connected to the air channel 600, and remaining holes may be connected to the speaker channel 500. Hereinafter, for the convenience of descriptions, a frame hole 207 of the multiple frame holes 207, which is connected to the air channel 600, may be referred to as a first frame hole 207A, and a frame holes 207 which is connected to the speaker channel 500, may be referred to as a second frame hole 207B.

The frame holes 207 may be formed in an identical shape and spaced apart from each other at the same interval, and thus may recognized as holes configured to perform the same function. In the electronic device 400 according to various embodiments disclosed herein, some the frame holes 207 may be used as a hole for the air channel 600, and remaining holes may be used as a hole for the speaker channel 500. Accordingly, the electronic device 400 of the embodiment does not need to be separately provided with a hole for the air channel 600. That is, a hole for the air channel 600 may be not separately formed, and the multiple frame holes 207 having a sense of unity may be used as holes for the air channel 600 and the speaker channel 500. Therefore, the process steps thereof can be reduced so as to reduce the process cost thereof, and the aesthetic sense of the electronic device 400 can be improved.

First, referring to FIG. 5, the speaker channel 500, which is configured to output sound of the speaker module 470 to the outside of the electronic device 400, will be described.

In an embodiment, the speaker channel 500 may include a first speaker channel 510 formed in the internal mechanical element 420 in which the speaker module 470 is accommodated, and a second speaker channel 520 formed in the support mechanical element 430 to be connected to the first speaker channel 510. The first speaker channel 510, which is formed in the internal mechanical element 420, may be connected to the second frame hole 207B. Sound output from the speaker module 470 may be output to the outside of the electronic device 400 via the second speaker channel 520—the first speaker channel 510—the second frame hole 207B.

Referring to FIG. 5, the internal mechanical element 420 may include a first inclined surface 420A formed to be inclined with respect to the first direction (e.g., the −Y-axis direction of FIG. 5) in which the frame hole 207 is formed, and the support mechanical element 430 may include a second inclined surface 430A formed to be inclined with respect to the first direction. The internal mechanical element 420 and the support mechanical element 430 may be arranged such that the first inclined surface 420A and the second inclined surface 430A are in contact with each other. The second speaker channel 520, which is formed in the support mechanical element 430, may be configured to extend to the second inclined surface 430A, and the first speaker channel 510, which is formed in the internal mechanical element 420, may be configured to extend to the first inclined surface 420A. The first speaker channel 510 and the second speaker channel 520 may be connected to each other at a portion in which the first inclined surface 420A and the second inclined surface 430A are contact with each other.

In an embodiment, a sealing member 450, which is configured to block moisture and foreign materials introduced into the speaker channel 500, may be disposed between the first inclined surface 420A of the internal mechanical element 420 and the second inclined surface 430A of the support mechanical element 430. The sealing member 450 may include a retaining part 452 configured to fix the sealing member, and a blocking part 451 configured to block moisture and foreign materials. For example, the blocking part 451 may include a waterproof material (e.g., Gore-Tex) and may include a mesh structure. For example, the sealing member 450 may be attached and fixed to at least one of the first inclined surface 420A and the second inclined surface 430A by the retaining part 452 formed of an adhesive material.

Next, the air channel 600 will be described with reference to FIG. 6.

In an embodiment, the air channel 600 may include a first hole 610 and a second hole 620. The formation directions of the first hole 610 and the second hole 620 may be different from each other. For example, as illustrated in FIG. 6, the first hole 610 may be formed in the first direction (e.g., the −Y-axis direction of FIG. 6) which is the same direction as the formation direction of the frame hole 207, and the second hole 620 may be formed in a direction (e.g., the Z-axis direction of FIG. 6) perpendicular to the formation direction of the first hole 610.

According to various embodiments, as illustrated in FIG. 6, the air vent 601 may be disposed in the second hole 620. The air vent 601 may be formed of a material capable of allowing the flow of air but blocking the flow of moisture or foreign materials. For example, the air vent 601 may include a waterproof material (e.g., Gore-Tex).

The air vent 601 may be disposed in the second hole 620 which is formed in a direction perpendicular to the extension direction of the first hole 610 connected to the first frame hole 207A directly connected to the outside of the electronic device 400, so as to reduce the risk of damage of the air vent 601. For example, even when pointed objects are inserted through the first frame hole 207A, since the air vent 601 is disposed in the second hole 620 formed in a direction different from the first frame hole 207A, it may be possible to reduce the risk in which the air vent 601 is damaged by an external object.

In various embodiments, the first hole 610 and the second hole 620 of the air channel 600 may be holes formed through the internal mechanical element 420.

Referring to FIG. 6, the first hole 610 may be formed through a surface opposite to the first inclined surface 420A of the internal mechanical element 420.

According to various embodiments, the first hole 610 may include a first section (hereinafter (1-1)st hole 611) and a second section (hereinafter (1-2)nd hole 612). The (1-1)st hole 611 may be a hole formed through the internal mechanical element 420 to be connected to the first frame hole 207A. The (1-2)nd hole 612 may be a hole formed through the internal mechanical element 420 to be connected to the (1-1)st hole 611.

As illustrated in FIG. 6, the (1-1)st hole 611 and the (1-2)nd hole 612 may be formed to have diameters different from each other. For example, the diameter of the (1-1)st hole 611 may be greater than the diameter of the (1-2)nd hole 612. In an embodiment, the (1-1)st hole 611 may be formed to have a diameter substantially the same as the diameter of the first frame hole 207A.

The first hole 610 and the second hole 620 of the air channel 600 may be formed in various ways. In an embodiment, the second hole 620 may be formed by a mold 730, and the first hole 610 may be formed through a cutting process by the machining body 710 and 720. In various embodiments, both the first hole 610 and the second hole 620 may be formed through an injection molding manner by a mold. In this case, for injection, the first hole 610 may be formed by a sliding core capable of sliding with respect to an injection molded product. In addition, the first hole 610 and the second hole 620 may be formed in various ways. Hereinafter, it will be described on the assumption that the second hole 620 is formed through a mold, and the first hole 610 is formed through a cutting process.

Referring to FIG. 7, when the (1-1)st hole 611 and the (1-2)nd hole 612 are formed to have different diameters, the (1-1)st hole 611 and the (1-2)nd hole 612 may be formed by machining bodies different from each other, respectively. For example, the (1-1)st hole 611 may be first formed by a first machining body 710, and then the (1-2)nd hole 612 may be formed by a second machining body 720 having a diameter smaller than the first machining body 710. In an embodiment, when the frame hole 207 and the (1-1)st hole 611 are formed to have the same diameter, the frame hole 207 and the (1-1)st hole 611 may be formed at once by the first machining body 710.

In an embodiment, when the (1-1)st hole 611 and (1-2)nd hole 612 having different diameters constitute the air channel 600, a first partition wall W1 formed due to the (1-1)st hole 611 and a second partition wall W2 formed due to the (1-2)nd hole 612 may be provided in a passage configured to allow air to be introduced through the air channel 600.

External moisture introduced through the first frame hole 207A may be introduced into the first frame hole 207A in a direction (e.g., the Y-axis direction of FIG. 6) parallel to the first direction, which is the formation direction of the first frame hole 207A. Moisture introduced into the first frame hole 207A may be first in contact with first partition wall W1, and then may be in contact with the second partition wall W2. In the process, the entering velocity (the flow velocity) and the amount (flow rate) of moisture may be reduced. Through the process, a part of the moisture introduced into the first frame hole 207A may be introduced into the second hole 620 in a state where the velocity and amount thereof are reduced. Although moisture is introduced into the first frame hole 207A, since moisture is introduced into the second hole 620 in a state where the velocity and amount thereof are reduced, it may be possible to reduce a phenomenon in which the air vent 601 disposed in the second hole 620 is damaged by hydraulic pressure of moisture.

In an embodiment, at least a part of a display module 490 (e.g., the display module 160 of FIG. 1) may be supported by the internal mechanical element 420. The air channel 600 may include a space 630 provided between the display module 490 and the internal mechanical element 420. The space 630 may be connected to the second hole 620. External air may be introduced into the space 630 provided between the display module 490 and the internal mechanical element 420 through first frame hole 207A—the (1-1)st hole 611—the (1-2)nd hole 612—the second hole 620, and then may move into the electronic device 400.

The difference between the pressure of the inner space of the electronic device 400 and the pressure outside the electronic device 400 may be reduced by the air channel 600.

Figure 8:
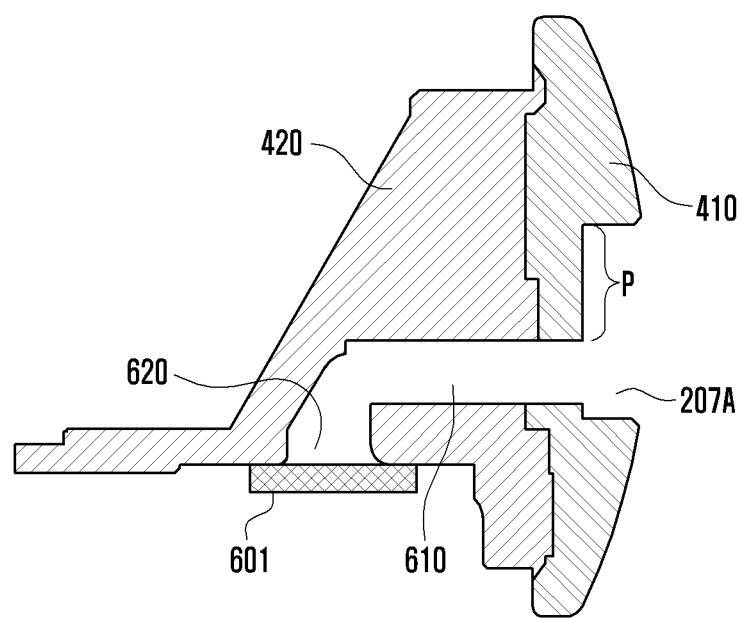
FIG. 8 is a cross-sectional view of an air channel according to an embodiment of the disclosure.

FIG. 8 is a cross-sectional view of an air channel according to an embodiment of the disclosure.

According to various embodiments, as illustrated FIG. 7, the frame hole 207 may be formed by completely perforating a part of the frame 410. In various embodiments, as illustrated in FIG. 8, the frame hole 207 may be a portion concavely formed on the frame 410.

In an embodiment, at least one frame hole 207 of the multiple frame holes 207 may be a portion concavely formed on the frame 410. For example, as illustrated in FIG. 8, the frame hole 207 may be formed to have a depth smaller than the thickness of the frame 410.

According to various embodiments, the first frame hole 207A, which is connected to the air channel 600, may be a portion concavely formed on the outer surface of the frame 410. The first hole 610 of the air channel 600 may be formed to have a diameter smaller than the first frame hole 207A. The first hole 610 may be formed in the same direction as the formation direction of the first frame hole 207A so as to be formed through a part of the internal mechanical element 420 and the frame 410. The first frame hole 207A and the second hole 620 may be connected by the first hole 610.

Referring to FIG. 8, the first frame hole 207A is not a portion formed by completely perforating the frame 410. Therefore, when the first frame hole 207A is seen from the outside, a part P inside the first frame hole 207A may look the same as the outer surface of the frame 410. The part P inside the first frame hole 207A may be formed of the same material as the frame 410, and thus may look the same texture or color as the outer surface of the frame 410.

An electronic device (e.g., the electronic device 101 of FIG. 1, the electronic device 200 of FIGS. 2A and 2B, the electronic device 300 of FIG. 3, and the electronic device 400 of FIGS. 4A and 4B) according to various embodiments disclosed herein may include a frame (e.g., the frame 410 of FIG. 4A) constituting at least a part of the side exterior of the electronic device, an internal mechanical element (e.g., the internal mechanical element 420 of FIG. 4A) disposed inside the frame, multiple frame holes (e.g., the sound hole 207 of FIG. 2A or the frame holes 207 of FIG. 4B) formed through the frame at a predetermined interval in an identical shape, an air channel (e.g., the air channel 600 of FIG. 6) including a first hole (e.g., the first hole 610 of FIG. 6), at least a part of which is formed through the internal mechanical element in a first direction so as to be connected to at least one of the multiple frame holes, and a second hole (e.g., the second hole 620 of FIG. 6) formed through the internal mechanical element in a direction perpendicular to the first direction so as to be connected to the first hole, an air vent (e.g., the air vent 601 of FIG. 6) disposed in the second hole of the air channel, and a speaker channel (e.g., the speaker channel 500 of FIG. 5) connected to remaining holes of the multiple frame holes and connected to a speaker module (e.g., the speaker module 470 of FIG. 5).

In addition, the first hole may include a (1-1)st hole (e.g., the (1-1)st hole 611 of FIG. 6) connected to one of the multiple frame holes and a (1-2)nd hole (e.g., the (1-2)nd hole 612 of FIG. 6) formed with a diameter smaller than the (1-1)st hole and configured to connect the (1-1)st hole and the second hole.

In addition, the (1-1)st hole of the first hole may be formed by a first machining body (e.g., the first machining body 710 of FIG. 7), and then the (1-2)nd hole may be formed by a second machining body (e.g., the second machining body 720 of FIG. 7) having a diameter smaller than the first machining body.

In addition, the (1-1)st hole may be formed to have a diameter substantially the same as the diameter of the frame hole connected to the (1-1)st hole.

In addition, a support mechanical element (e.g., the support mechanical element 430 of FIG. 5), of which at least a part is configured to support the speaker module and in which a part of the speaker channel is formed, may be included therein, wherein a first inclined surface (e.g., the first inclined surface 420A of FIG. 5) of the internal mechanical element and a second inclined surface (e.g., the second inclined surface 430A of FIG. 5) of the support mechanical element are arranged to be in contact with each other, the first inclined surface being formed to be inclined with respect to the first direction, the second inclined surface being formed to be inclined with respect to the first direction.

In addition, the first hole may be formed in a surface opposite to the first inclined surface of the internal mechanical element.

In addition, a sealing member (e.g., the sealing member 450 of FIG. 5) disposed between the first inclined surface of the internal mechanical element and the second inclined surface of the support mechanical element so as to block foreign materials and moisture introduced into the speaker channel, may be included therein.

In addition, a display module (e.g., the display module 490 of FIG. 6), at least a part of which is supported by the internal mechanical element, may be included therein, wherein the air channel may further include a space (e.g., the space 630 of FIG. 6) connected to the second hole and provided between the display module and the internal mechanical element.

In addition, the air vent may be formed of a material configured to allow the flow of air and to block the flow of moisture.

In addition, the frame hole, which is connected to the first hole of the multiple frame holes, may be concavely formed on the frame to have a depth smaller than the thickness of the frame, and the first hole may have a diameter smaller than the frame hole and may be formed through the internal mechanical element and the frame.

A channel structure of an electronic device (e.g., the electronic device 101 of FIG. 1, the electronic device 200 of FIGS. 2A and 2B, the electronic device 300 of FIG. 3, and the electronic device 400 of FIGS. 4A and 4B) according to various embodiments disclosed herein may include multiple frame holes (e.g., the sound hole 207 of FIG. 2A or the frame hole 207 of FIG. 4B) formed through a frame (e.g., the frame 410 of FIG. 4A) constituting at least a part of the side exterior of the electronic device at a predetermined interval in an identical shape, an air channel (e.g., the air channel 600 of FIG. 6) including a first hole (e.g., the first hole 610 of FIG. 6), at least a part of which is formed through an internal mechanical element (e.g., the internal mechanical element 420 of FIG. 4A) disposed inside the frame in a first direction so as to be connected to at least one of the multiple frame holes, and a second hole (e.g., the second hole 620 of FIG. 6) formed through the internal mechanical element in a direction perpendicular to the first direction so as to be connected to the first hole, an air vent (e.g., the air vent 601 of FIG. 6) disposed in the second hole of the air channel, and a speaker channel (e.g., the speaker channel 500 of FIG. 5) connected to remaining holes of the multiple frame holes and connected to a speaker module (e.g., the speaker module 470 of FIG. 5).

In addition, the first hole may include a (1-1)st hole (e.g., the (1-1)st hole 611 of FIG. 6) connected to one of the multiple frame holes and a (1-2)nd hole (e.g., the (1-2) nd hole 612 of FIG. 6) formed with a diameter smaller than the (1-1)st hole and configured to connect the (1-1)st hole and the second hole.

In addition, the (1-1)st hole of the first hole may be formed by a first machining body (e.g., the first machining body 710 of FIG. 7), and then the (1-2)nd hole may be formed by a second machining body (e.g., the second machining body 720 of FIG. 7) having a diameter smaller than the first machining body.

In addition, the (1-1)st hole may be formed to have a diameter substantially the same as the diameter of the frame hole connected to the (1-1)st hole.

In addition, a first inclined surface (e.g., the first inclined surface 420A of FIG. 5) of the internal mechanical element and a second inclined surface (e.g., the second inclined surface 430A of FIG. 5) may be arranged to be in contact with each other, wherein the first inclined surface is formed to be inclined with respect to the first direction, and the second inclined surface is formed to be inclined with respect to the first direction in a support mechanical element (e.g., the support mechanical element 430 of FIG. 5), of which at least a part is configured to support the speaker module and in which a part of the speaker channel is formed.

In addition, the first hole may be formed in a surface opposite to the first inclined surface of the internal mechanical element.

In addition, a sealing member (e.g., the sealing member 450 of FIG. 5) disposed between the first inclined surface of the internal mechanical element and the second inclined surface of the support mechanical element to block foreign materials and moisture introduced into the speaker channel, may be included therein.

In addition, the air channel may further include a space (e.g., the space 630 of FIG. 6) connected to the second hole and provided between a display module (e.g., the display module 490 of FIG. 6) of the electronic device and the internal mechanical element.

In addition, the air vent may be formed of a material configured to allow the flow of air and to block the flow of moisture.

In addition, the frame hole, which is connected to the first hole of the multiple frame holes, may be concavely formed on the frame to have a depth smaller than the thickness of the frame, and the first hole may have a diameter smaller than the frame hole and may be formed through the internal mechanical element and the frame.

Embodiments of the disclosure disclosed in the specification and the drawings of the disclosure are merely specific examples presented to easily describe the technical content according to various embodiments of the disclosure and to help understanding of the disclosure, and are not intended to limit the scope of embodiments of the disclosure. Accordingly, in connection with the scope of various embodiments disclosed herein, it is interpreted that the scope of various embodiments disclosed herein includes not only embodiments disclosed herein but also all changed or modified forms derived based on the technical idea of various embodiments disclosed herein.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    a frame constituting at least a part of a side exterior of the electronic device;
    an internal mechanical element disposed inside the frame;
    a plurality of frame holes formed through the frame at a predetermined interval in an identical shape;
    an air channel comprising a first hole, at least a part of which is formed through the internal mechanical element in a first direction so as to be connected to at least one of the plurality of frame holes, and a second hole formed through the internal mechanical element in a direction perpendicular to the first direction so as to be connected to the first hole;
    an air vent disposed in the second hole of the air channel; and
    a speaker channel connected to remaining holes of the plurality of frame holes and connected to a speaker module.

2. The electronic device of claim 1, wherein the first hole comprises a first section connected to a frame hole of the plurality of frame holes and a second section formed with a diameter smaller than a diameter of the first section and configured to connect the first section and the second hole.

3. The electronic device of claim 2, wherein the first section of the first hole is formed by a first machining body, and then the second section is formed by a second machining body having a diameter smaller than the first machining body.

4. The electronic device of claim 2, wherein the first section is formed to have a diameter substantially the same as the diameter of the frame hole connected to the first section.

5. The electronic device of claim 1, further comprising:
    a support mechanical element, of which at least a part is configured to support the speaker module and in which a part of the speaker channel is formed, wherein a first inclined surface of the internal mechanical element and a second inclined surface of the support mechanical element are arranged to be in contact with each other,
wherein the first inclined surface being formed to be inclined with respect to the first direction, and
wherein the second inclined surface being formed to be inclined with respect to the first direction.

6. The electronic device of claim 5, wherein the first hole is formed on a surface opposite to the first inclined surface of the internal mechanical element.

7. The electronic device of claim 5, further comprising:
a sealing member disposed between the first inclined surface of the internal mechanical element and the second inclined surface of the support mechanical element so as to block foreign materials and moisture introduced into the speaker channel.

8. The electronic device of claim 1, further comprising:
a display module, at least a part of which is supported by the internal mechanical element,
wherein the air channel further comprises a space connected to the second hole and provided between the display module and the internal mechanical element.

9. The electronic device of claim 1, wherein the air vent is formed of a material configured to allow a flow of air and to block a flow of moisture.

10. The electronic device of claim 1,
wherein a frame hole connected to the first hole of the plurality of frame holes is concavely formed on the frame to have a depth smaller than a thickness of the frame, and
wherein the first hole has a diameter smaller than the frame hole and is formed through the internal mechanical element and the frame.

11. A channel structure of an electronic device, the channel structure comprising:
a plurality of frame holes formed through a frame constituting at least a part of a side exterior of the electronic device at a predetermined interval in an identical shape;
an air channel comprising a first hole, at least a part of which is formed through an internal mechanical element disposed inside the frame in a first direction so as to be connected to at least one of the plurality of frame holes, and a second hole formed through the internal mechanical element in a direction perpendicular to the first direction so as to be connected to the first hole;
an air vent disposed in the second hole of the air channel; and
a speaker channel connected to remaining holes of the plurality of frame holes and connected to a speaker module.

12. The channel structure of claim 11, wherein the first hole comprises a first section connected to a frame hole of the plurality of frame holes and a second section formed with a diameter smaller than the first section and configured to connect the first section and the second hole.

13. The channel structure of claim 12, wherein the first section of the first hole is formed by a first machining body, and then the second section is formed by a second machining body having a diameter smaller than the first machining body.

14. The channel structure of claim 12, wherein the first section is formed to have a diameter substantially the same as the diameter of the frame hole connected to the first section.

15. The channel structure of claim 11,
wherein a first inclined surface of the internal mechanical element and a second inclined surface are arranged to be in contact with each other,
wherein the first inclined surface being formed to be inclined with respect to the first direction, and
wherein the second inclined surface being formed to be inclined with respect to the first direction, in a support mechanical element, of which at least a part is configured to support the speaker module and in which a part of the speaker channel is formed.

16. The channel structure of claim 15, wherein the first hole is formed on a surface opposite to the first inclined surface of the internal mechanical element.

17. The channel structure of claim 15, further comprising:
a sealing member disposed between the first inclined surface of the internal mechanical element and the second inclined surface of the support mechanical element so as to block foreign materials and moisture introduced into the speaker channel.

18. The channel structure of claim 11, wherein the air channel further comprises a space connected to the second hole and provided between a display module of the electronic device and the internal mechanical element.

19. The channel structure of claim 11, wherein the air vent is formed of a material configured to allow a flow of air and to block a flow of moisture.

20. The channel structure of claim 11,
wherein a frame hole connected to the first hole of the plurality of frame holes is concavely formed on the frame to have a depth smaller than a thickness of the frame, and
wherein the first hole has a diameter smaller than the frame hole and is formed through the internal mechanical element and the frame.

* * * * *